(12) United States Patent
Liang et al.

(10) Patent No.: US 8,228,126 B2
(45) Date of Patent: Jul. 24, 2012

(54) MULTI-BAND BURST-MODE CLOCK AND DATA RECOVERY CIRCUIT

(75) Inventors: Che-Fu Liang, Taipei (TW); Sy-Chyuan Hwu, Taipei (TW); Shen-Iuan Liu, Taipei (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 12/104,608

(22) Filed: Apr. 17, 2008

(65) Prior Publication Data
US 2008/0260087 A1 Oct. 23, 2008

Related U.S. Application Data

(60) Provisional application No. 60/912,700, filed on Apr. 19, 2007.

(51) Int. Cl.
*H03L 7/085* (2006.01)
*H03L 7/089* (2006.01)
*H03L 7/04* (2006.01)

(52) U.S. Cl. ............. 331/1 A; 331/2; 331/172; 331/173; 331/57; 375/375; 375/376

(58) Field of Classification Search .................. 331/1 A, 331/2, 173, 57, 172; 375/375, 376
See application file for complete search history.

(56) References Cited

U.S. PATENT DOCUMENTS

| | | | | |
|---|---|---|---|---|
| 4,458,165 A | * | 7/1984 | Jackson | 327/276 |
| 5,355,097 A | * | 10/1994 | Scott et al. | 331/1 A |
| 5,834,980 A | * | 11/1998 | Pitio et al. | 331/2 |
| 5,982,241 A | * | 11/1999 | Nguyen et al. | 331/49 |
| 6,771,134 B2 | * | 8/2004 | Wong et al. | 331/57 |
| 7,227,482 B2 | * | 6/2007 | San et al. | 341/143 |
| 2004/0251944 A1 | * | 12/2004 | Ma | 327/198 |
| 2006/0031701 A1 | * | 2/2006 | Nam et al. | 713/500 |
| 2006/0140309 A1 | * | 6/2006 | Kuo et al. | 375/326 |
| 2007/0018694 A1 | * | 1/2007 | Chen et al. | 326/115 |
| 2008/0232524 A1 | * | 9/2008 | Liu et al. | 375/355 |

OTHER PUBLICATIONS

Author: Han and Woo-Young Choi Title: 1.25/2.5-Gb/s Dual Bit-Rate Burst-Mode Clock Recovery Circuit in 0.18-micrometer CMOS technology Date: Jan. 2007 Publisher: IEEE Transactions on circuit and system Volume: 54, No. 1.*

Author: Pyung-Su Han and Woo-Yong Choi Title: 1.25/2.5-Gb/s Dual Bit-Rate Burst-Mode Clock Recovery Circuits in 0.18-micro m CMOS Technology Date: Jan. 2007 Publisher: IEEE Transactions on circuits and systems-II: Express Briefs vol.: 54, No. 1.*

(Continued)

*Primary Examiner* — Arnold Kinkead
*Assistant Examiner* — Richard Tan
(74) *Attorney, Agent, or Firm* — Thomas|Kayden

(57) ABSTRACT

A clock and data recovery circuit is disclosed and comprises a gated voltage-controlled oscillator (GVCO), a PLL unit, a phase-controlled frequency divider, a multiplexer, a matching circuit and a double-edge-triggered D flip-flop (DDFF). The GVCO receives a data signal and a reference voltage to generate first and second clock signals. The PLL unit receives a reference clock signal and generates the reference voltage to adjust the first and second clock signals at the vicinity of the predetermined frequency. The phase-controlled frequency divider receives and divides the first clock signal by N to output a third clock signal. The multiplexer controlled by a selection signal receives and outputs the second or the third clock signal. The matching circuit receives the data signal and the selection signal to match the delays therebetween. The DDFF receives the output signals from the matching circuit and the multiplexer, and outputs a recovered data signal.

16 Claims, 10 Drawing Sheets

OTHER PUBLICATIONS

"A Multi-Band Burst-Mode Clock and Data Recovery Circuit" Liang et al.; IEICE Trans. Electron., vol. E90-C, No. 4, Apr. 2007; pp. 802-810.

"A 10Gbps Burst-Mode CDR Circuit in 0.18μm CMOS" Liang et al.; Graduate Institute of Electronics Engineering & Dept of Electrical Engineering; Sep. 2006.

* cited by examiner

US 8,228,126 B2

MULTI-BAND BURST-MODE CLOCK AND DATA RECOVERY CIRCUIT

CROSS REFERENCE TO RELATED APPLICATIONS

This application claims the benefit of U.S. Provisional Application No. 60/912,700, filed Apr. 19, 2007.

BACKGROUND OF THE INVENTION

1. Field of the Invention

The invention relates to a clock and data recovery circuit, and more particularly to a multi-band burst-mode clock and data recovery circuit.

2. Description of the Related Art

Passive optical networks (PONs) solve bottlenecks among back-bone networks and LANs. To connect many optical network units (ONUs) with an optical line termination (OLT), the time division multiple access (TDMA) scheme is adopted. Therefore, the OLT may receive the sequent burst-mode data from ONUs. The clock and data recovery (CDR) circuit at the OLT must detect the input data within tens of bit times and recover the clock and data. It is difficult for the conventional CDR circuits to settle within such a short time. Conventional gated voltage-controlled oscillators (GVCOs) are roughly classified into two categories. One uses the edge detection circuit with a half bit-time delay line to trigger the GVCO. The accuracy of the half bit-time delay line limits the jitter tolerance and bit-error rate. The other combines two GVCOs with a NOR gate or multiplexer to realize a burst-mode clock and data recovery (BMCDR) circuit. The conventional GVCOs operate within two states: one is the oscillating state and the other is the latching state. The result is significant inter-symbol interference (ISI) caused by random data patterns for the GVCOs. Moreover, the delay cells in a GVCO are composed of logic gates instead of simple inverters, which increase the bandwidth requirement of the delay cells. In the disclosure, a half-rate GVCO using only multiplexers is presented. The bandwidth requirement of the delay cells is relaxed and low ISI is also achieved. Furthermore, a novel multi-band BMCDR architecture combined with proposed circuits is as well to meet the different standards specified by PONs.

BRIEF SUMMARY OF THE INVENTION

In one aspect of the invention, a gated voltage-controlled oscillator composing of six multiplexers is disclosed. The first multiplexer comprises a first input terminal, a second input terminal and an output terminal outputting a second clock signal, wherein the output terminal outputs signal from the first input terminal or signal from the second input terminal based on the data signal. The second multiplexer comprises a first input terminal, a second input terminal and an output terminal, wherein the output terminal outputs signal from the first input terminal or signal from the second input terminal based on the data signal. The third multiplexer comprises a first input terminal inverted coupled to the first input terminal of the second multiplexer, a second input terminal coupled to the inverted first input terminal of the second multiplexer and an output terminal, wherein the output terminal outputs signal from the first input terminal or signal from the second input terminal based on the data signal. The fourth multiplexer comprises a first input terminal receiving the output signal of the first multiplexer, a second input terminal grounded and an output terminal. The fifth multiplexer comprises a first input terminal coupled to the output terminal of the third multiplexer, a second input terminal coupled to the output terminal of the fourth multiplexer, and an output terminal coupled to the second input terminal of the third multiplexer. The sixth multiplexer comprises a first input terminal coupled to the output terminal of the fourth multiplexer, a second input terminal coupled to the output terminal of the second multiplexer, and an output terminal coupled to the first input terminal of the second multiplexer.

In another aspect of the invention, a clock and data recovery circuit with gated voltage-controlled oscillator is disclosed. The clock and data recovery circuit comprises a first gated voltage-controlled oscillator, a PLL unit, a phase-controlled frequency divider, a multiplexer, a matching circuit and a double-edge-triggered D flip-flop. The first gated voltage-controlled oscillator receives a data signal and a reference voltage to generate a first clock signal and a second clock signal based on the data signal. The PLL unit receives a reference clock signal and generates a reference voltage to lock the frequency of the first clock signal and the second clock signal at a predetermined frequency. The phase-controlled frequency divider receives and divides the first clock signal by N to output a third clock signal. The multiplexer controlled by a selection signal receives and outputs the second clock signal or the third clock signal. The matching circuit receives the data signal and the selection signal to match the delays therebetween. The double-edge-triggered D flip-flop comprises a data input terminal receiving the output signal from the matching circuit, a clock input terminal receiving the output signal from the multiplexer, and an output terminal outputting a recovered data signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
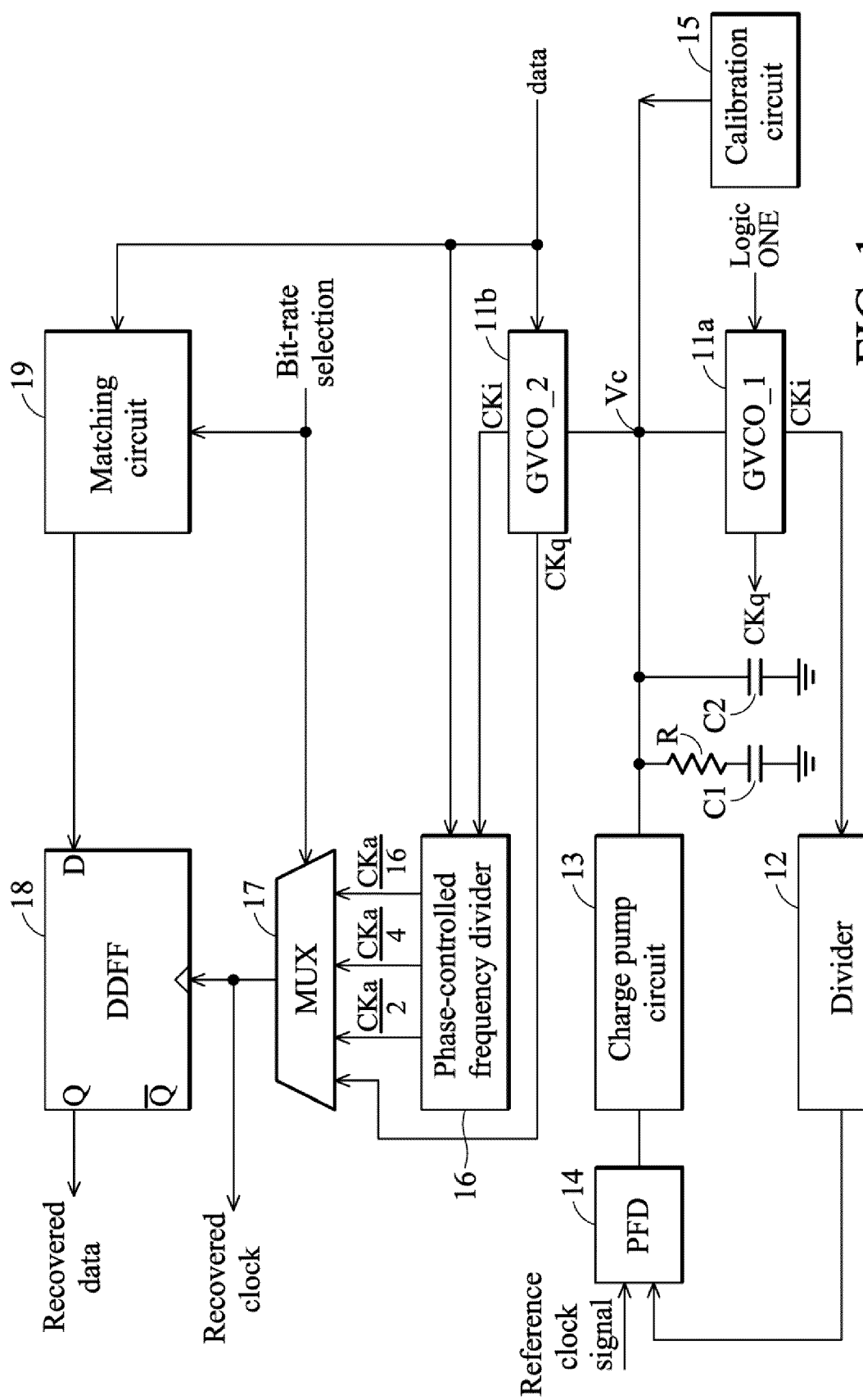
FIG. 1 is a schematic diagram of an embodiment of a clock and data recovery circuit according to the invention.

FIG. 1 is a schematic diagram of an embodiment of a clock and data recovery circuit according to the invention. The clock and data recovery circuit (CDR) comprises a PLL unit composing of the phase frequency detector (PFD) 14, the charge pump circuit 13, the gated voltage-controlled oscillator 11a (GVCO_1), and the divider 12. In the embodiment, the GVCO_1 11a can be regarded as a replica GVCO of the $GVCO_{\_2\ 11}b$. The GVCO—1 11 $a$ is connected to logic ONE and receives the reference voltage Vc to generate the clock signal CKi and CKq, wherein a phase delay exits between the clock signal CKi and CKq. The divider 12 receives and divides the clock signal CKi by a parameter N. The PFD 14 receives the output signal from the divider 12 and compares the clock signal divided from CKi with a reference clock signal to output a comparison signal. The charge pump circuit 13 transforms the comparison signal to a current and the reference voltage Vc is determined based on the current, the resistor R and capacitors C1 and C2. In one embodiment, the PLL unit is locked at 1.25 GHz, which is design for the half-rate data of 2.5 Gbps, with a reference clock signal of 19.53 MHz, and the divider 12 is a divide-by-64 divider.

The GVCO_2 receives the data signal and the reference voltage Vc, wherein the reference voltage Vc is fed to the GVCO_2 11b for generating the clock signals CKi and CKq and the data signal is for locking the frequency of the clock signals CKi and CKq to a desired frequency. In the embodiment, assuming the data rate of the data signal is 2 X/N bps (N=1, 2, 4, or 16), the frequency of the clock signals CKi and CKq is X Hz. The phase-controlled frequency divider 16 receives and divides the clock signal Cki by predetermined numbers to generate a plurality of clock signals, wherein the divided clock signals has the same phase with the clock signals CKq. In the embodiment, the frequencies of divided clock signals respectively are $^x/2$, $^x/4$ and $^x/16$. The multiplexer 17 is a 4-to-1 multiplexer, receives and outputs a recovery clock signal based on a bit-rate selection signal, wherein the recovery clock signal is selected from the clock signals CKq or one of the clock signals from the phase-controlled frequency divider 16. The matching circuit 19 receives the data signal and the selection signal to match the delays therebetween. The double-edge-triggered D flip-flop (DDFF) 18 comprises a data input terminal receiving the output signal from the matching circuit, a clock input terminal receiving the output signal from the multiplexer, and an output terminal outputting a recovered data signal.

Figure 2:
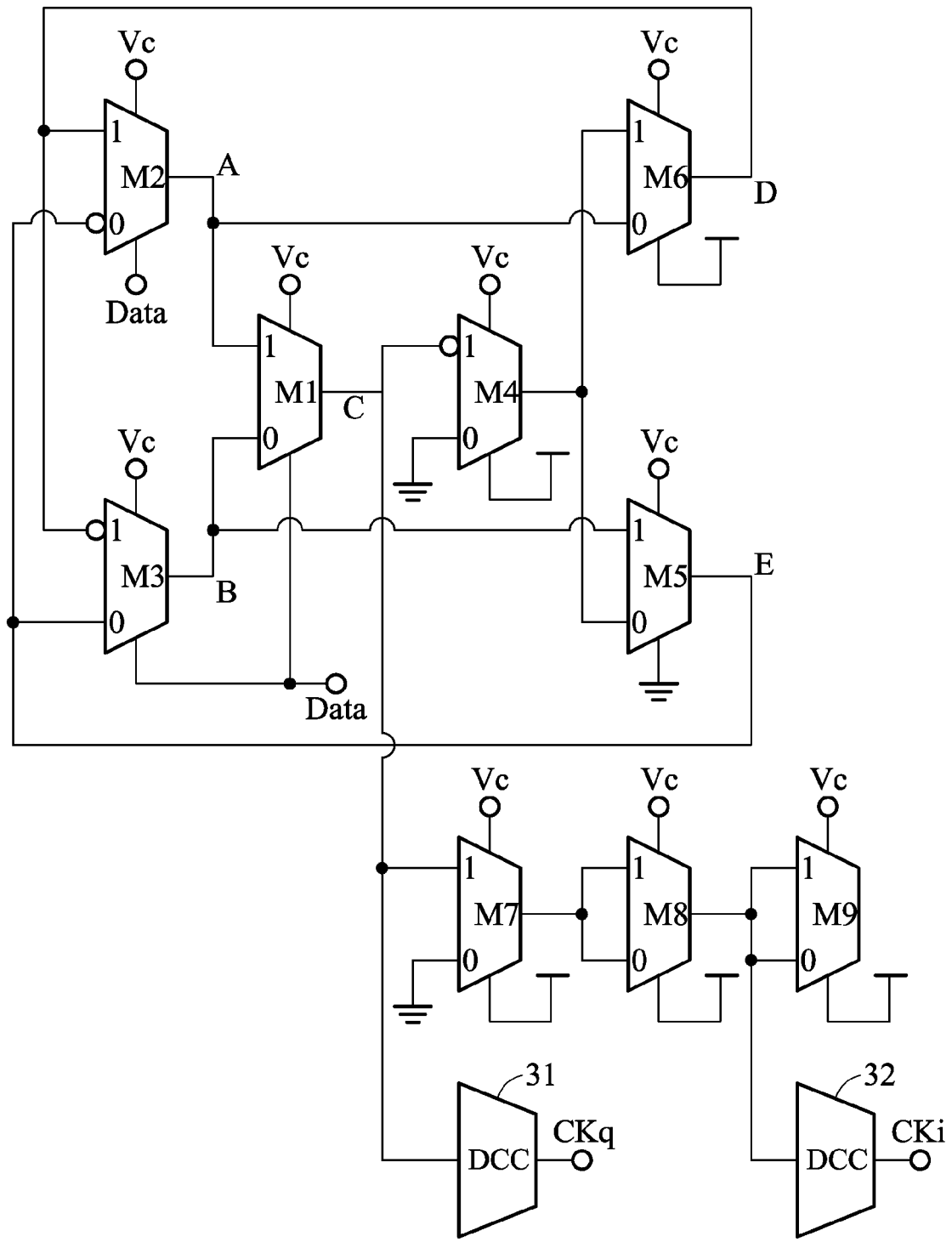
FIG. 2 is a block diagram of an embodiment of the gated voltage-controlled oscillator according to the invention.

FIG. 2 is a block diagram of an embodiment of the gated voltage-controlled oscillator according to the invention. The first multiplexer M1 comprises a first input terminal, a second input terminal and an output terminal outputting the clock signal CKq, wherein the output terminal outputs signal from the first input terminal or signal from the second input terminal based on the data signal. The second multiplexer M2 comprises a first input terminal, a second input terminal and an output terminal, wherein the output terminal outputs signal from the first input terminal or signal from the second input terminal based on the data signal. The third multiplexer M3 comprises a first input terminal inverted coupled to the first input terminal of the second multiplexer, a second input terminal coupled to the inverted second input terminal of the second multiplexer and an output terminal, wherein the output terminal outputs signal from the first input terminal or signal from the second input terminal based on the data signal. The fourth multiplexer M4 comprises a first input terminal receiving inversed output signal of the first multiplexer, a second input terminal grounded and an output terminal. The fifth multiplexer M5 comprises a first input terminal coupled to the output terminal of the third multiplexer, a second input terminal coupled to the output terminal of the fourth multiplexer, and an output terminal coupled to the second input terminal of the third multiplexer. The sixth multiplexer M6 comprises a first input terminal coupled to the output terminal of the fourth multiplexer, a second input terminal coupled to the output terminal of the second multiplexer, and an output terminal coupled to the first input terminal of the second multiplexer. The seventh multiplexer M7 comprises a first input terminal coupled to the output terminal of the first multiplexer, a second input terminal grounded, and an output terminal. The eighth multiplexer M8 comprises a first input terminal coupled to the output terminal of the seventh multiplexer M7, a second input terminal coupled to the output terminal of the seventh multiplexer M7, and an output terminal outputting the clock signal CKi. The ninth multiplexer M9 comprises a first input terminal coupled to the output terminal of the eighth multiplexer M8, a second input terminal coupled to the output terminal of the eighth multiplexer M8, and an output terminal.

In the embodiment, a first duty cycle correction circuit 31 and a second duty cycle correction circuit 32 is adopted. The first duty cycle correction circuit 31 receives the second clock signal CKq and outputs the clock signal CKq with a fixed-delay rising-edge. Similarly, the second duty cycle correction circuit 32 receives the second clock signal CKi and outputs the clock signal CKi with a fixed-delay rising-edge.

When the input data is high, the multiplexers M1, M2, M4 and M6 form an oscillator and M3 outputs the clock B, which is the complement of the clock A. On the other hand, when the input data is low, the multiplexers M1, M3, M4 and M5 form an oscillator and M2 outputs the clock A. Once the input data changes, the clock A or B tracks the data. For further illustration, please refer to FIG. 3.

Figure 3:
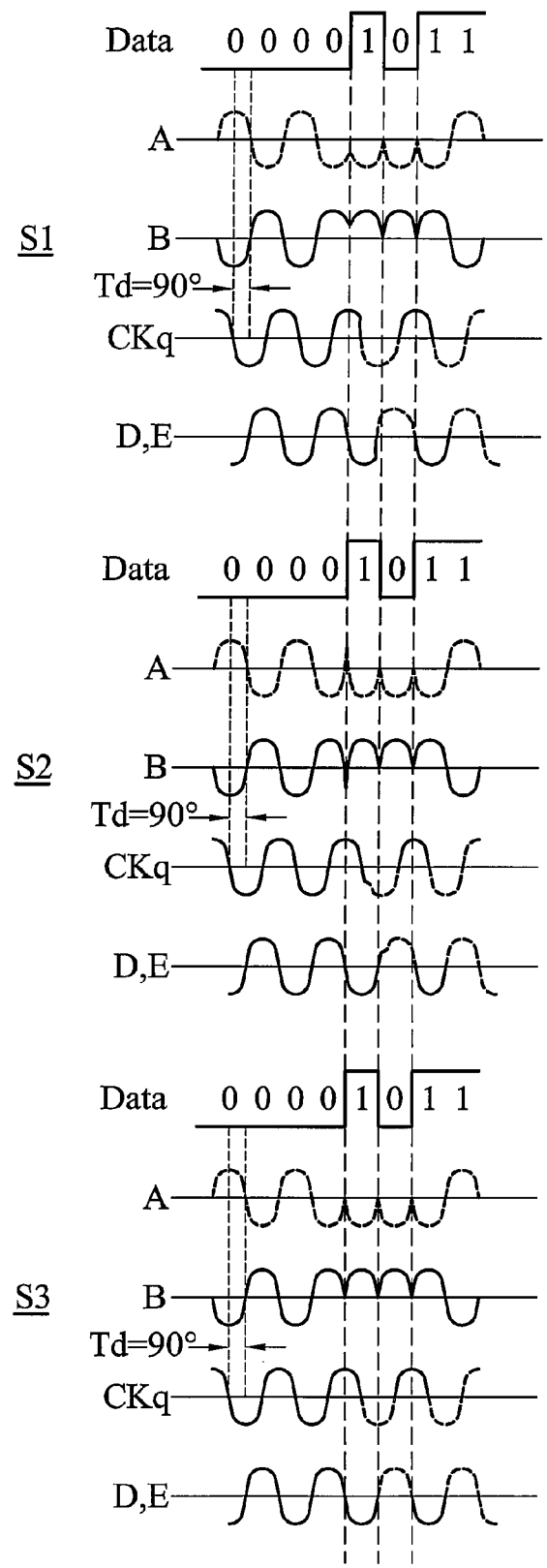
FIG. 3 is a waveform diagram of the gated voltage-controlled oscillator shown in FIG. 2.

FIG. 3 is a waveform diagram of the gated voltage-controlled oscillator shown in FIG. 2. As shown in St, when the clock lags data, the clocks A and B change their polarity before the threshold voltage. It is equivalent to speeding up the clock to compensate for the lagged phase. Similarly, in S2, when the clock leads data, the clock A and B change after the threshold voltage to correct the phase. When the CDR circuit is locked with the input data, the timing diagram is shown as in S3. Usually a conventional GVCO starts to oscillate when the input data is high and stops to be latched when the input data is low. Serious amplitude variations occur if the output is latched to VDD or GND. Due to the AM/PM conversion, the jitter of the conventional GVCO increases. In the proposed GVCO, the clock A or B is never latched. Thus, the ISI due to the amplitude variations is improved.

Figure 4:
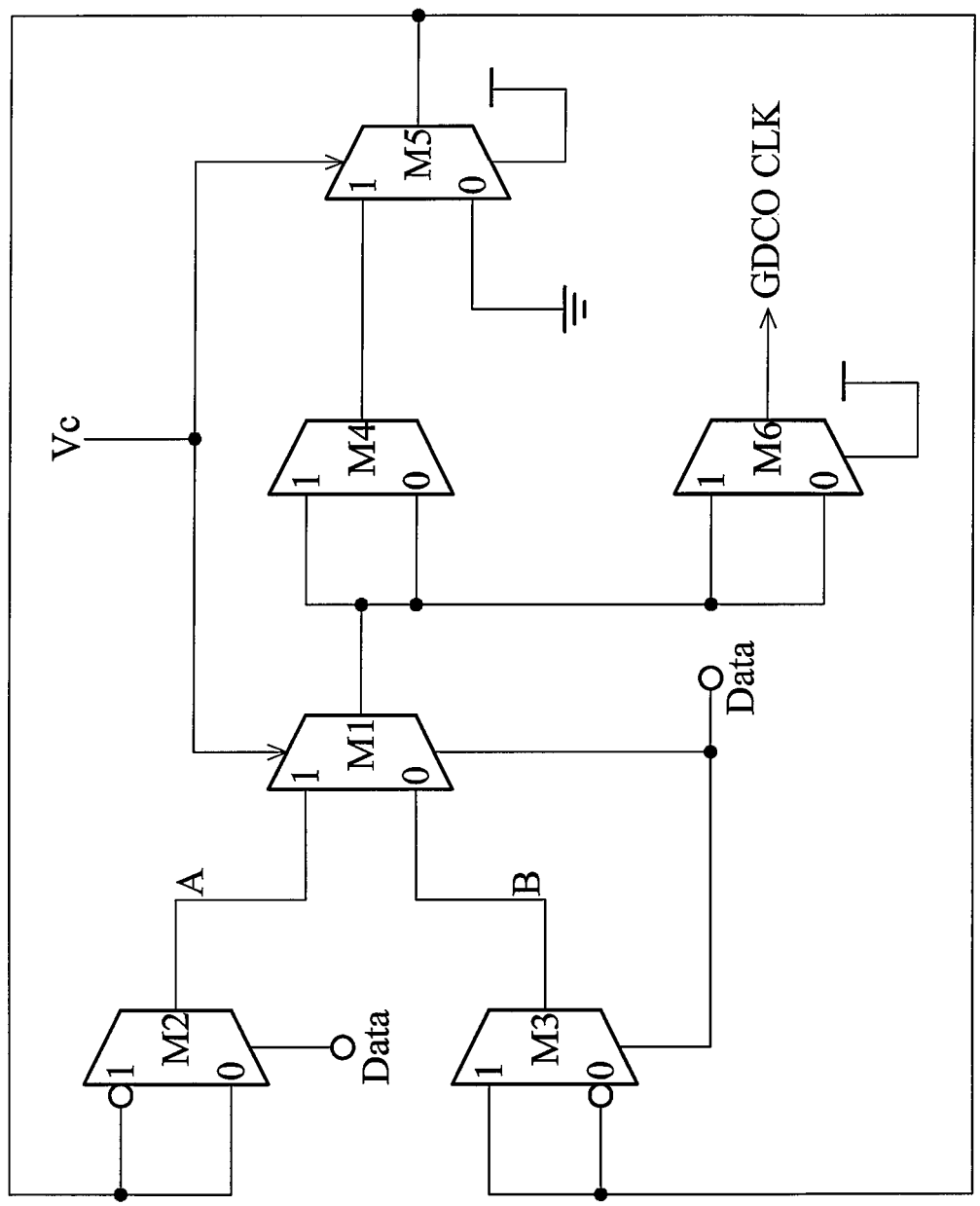
FIG. 4 is a block diagram of another embodiment of the gated voltage-controlled oscillator according to the invention.

FIG. 4 is a block diagram of another embodiment of the gated voltage-controlled oscillator according to the invention. The gated voltage-controlled oscillator is composed of five gated multiplexers, M1-M5, and one replica buffer, M6. The fourth multiplexer M4 and fifth multiplexer M5 are coupled together to generate a first clock signal. The first multiplexer M1 receives the reference voltage and comprises a first input terminal, a second input terminal. and an output terminal coupled to the fourth and fifth multiplexer M4 and M5, wherein the output terminal outputs signal from the first input terminal or signal from the second input terminal based on the data signal. The second multiplexer M2 comprises a third input terminal receiving an inverted first clock signal ,a fourth input terminal receiving the first clock signal, and an output terminal coupled to the first input terminal of the first multiplexer, wherein the output terminal outputs signal from the third input terminal or signal from the fourth input terminal based on the data signal. The third multiplexer M3 comprises a fifth input terminal receiving the first clock signal, a sixth input terminal receiving the inverted first clock signal, and an output terminal coupled to the second input terminal of the first multiplexer, wherein the output terminal outputs signal from the fifth input terminal or signal from the sixth input terminal based on the data signal Referring to the fourth multiplexer M4 and the fifth multiplexer M5. The fourth multiplexer comprises a seventh input terminal, an eighth input and an output terminal, wherein the seventh input terminal and an eighth input terminal are coupled to the output terminal of the first multiplexer M1. The fifth multiplexer M5 receives the reference voltage and comprises a ninth input terminal coupled to the output terminal of the fourth multiplexer M4, a tenth input terminal grounded, and an output terminal outputting the first clock signal. The sixth multiplexer M6 comprises an eleventh input terminal and a twelfth input terminal coupled to the output terminal of the first multiplexer M1, and an output terminal outputting the clock signal CKi and CKq. When the input data is high, the multiplexers, M1, M2, M4, and M5 form an oscillator, The multiplexer, M3 outputs the clock B, which is the complement of the clock A. When the input data is low, the multiplexers, M1, M3 ,M4, and M5 form another oscillator. The multiplexer, M2, outputs the clock A. Once the input data changes, the clock A or B tracks the data.

Figure 6:
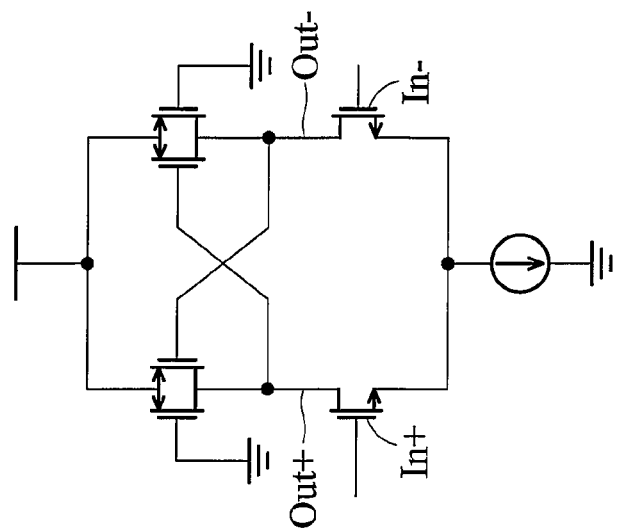
FIG. 6 is a schematic diagram of an embodiment of a DCC circuit used in the GVCO with CML logics according to the invention.
Figure 5:
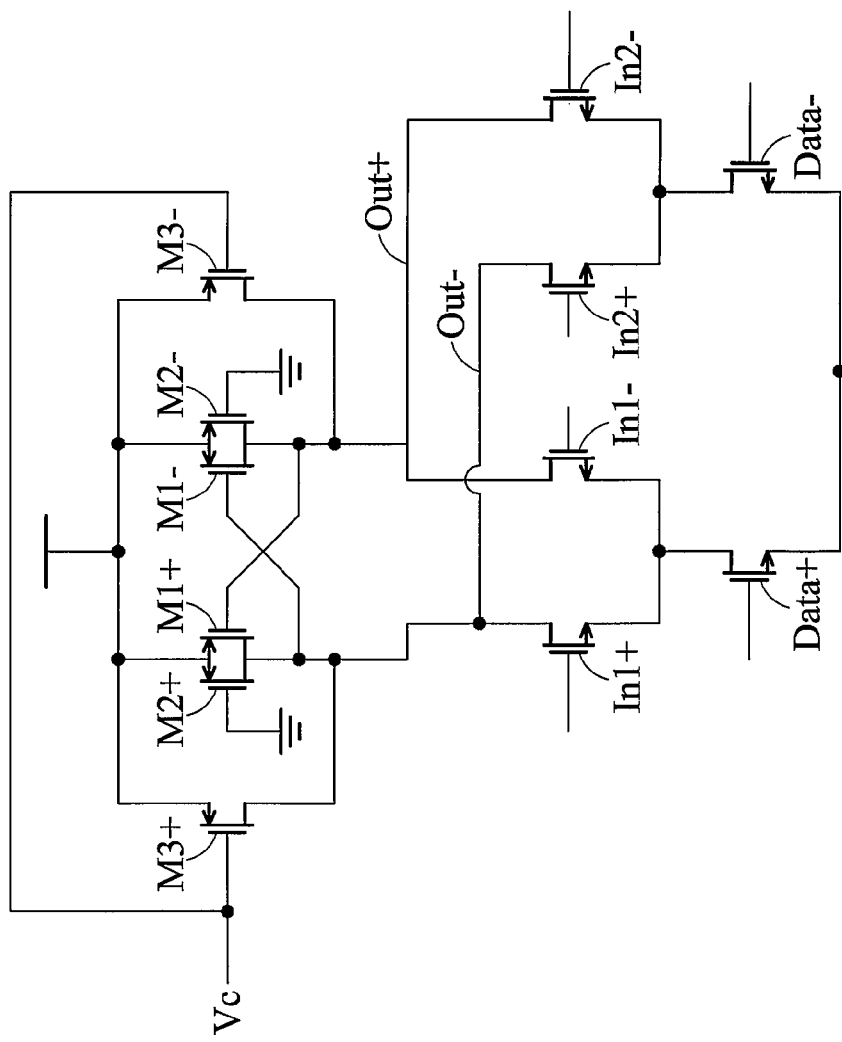
FIG. 5 is a schematic diagram of an embodiment of a delay cell used in the GVCO with CML logics according to the invention.

The delay cell for the proposed GVCO is shown in FIG. 5 which is a voltage-controlled multiplexer using the current-mode logics. In FIG. 5, M3+/− is used as a voltage-controlled resistor to adjust the delay. The gate of M2+/− is connected to ground to operate as a resistor. M1+ and M1− form a cross-coupled pair to make the transition faster. The data+/− is used to select one of the two inputs, in1+/− and in2+/−. The tail current source is used to reduce the supply noise, since it is current steering. To realize the GVCO, the current-mode logics (CMLs) are widely used and detailed description of the current-mode logics is not mentioned here for briefly. Usually the speed of the CML NAND or CML NOR gates is much slower than that of the CML multiplexer. It is because the parasitic capacitance of the cascade transistors is increased in NAND or NOR CML gates. Since the delay cell in FIG. 5 is realized by CML multiplexers, the proposed GVCO will have a wide bandwidth. The detailed architecture of the DCC circuit, such as the DCC 31 or 32, is shown in FIG. 6, and the DCC circuit is also added to ensure the half-rate operation. The detailed description of the current-mode logic used in the DCC circuit is not outlined here for briefly. In the embodiment, only 6 multiplexer-based delay cells are required in the proposed GVCO. This means lower power consumption for high data rate transmission. Furthermore, only three multiplexers experience input data switching, hence, the proposed GVCO also relaxes the output loading on the previous stage, such as a burst-mode limiting amplifier.

Figure 7:
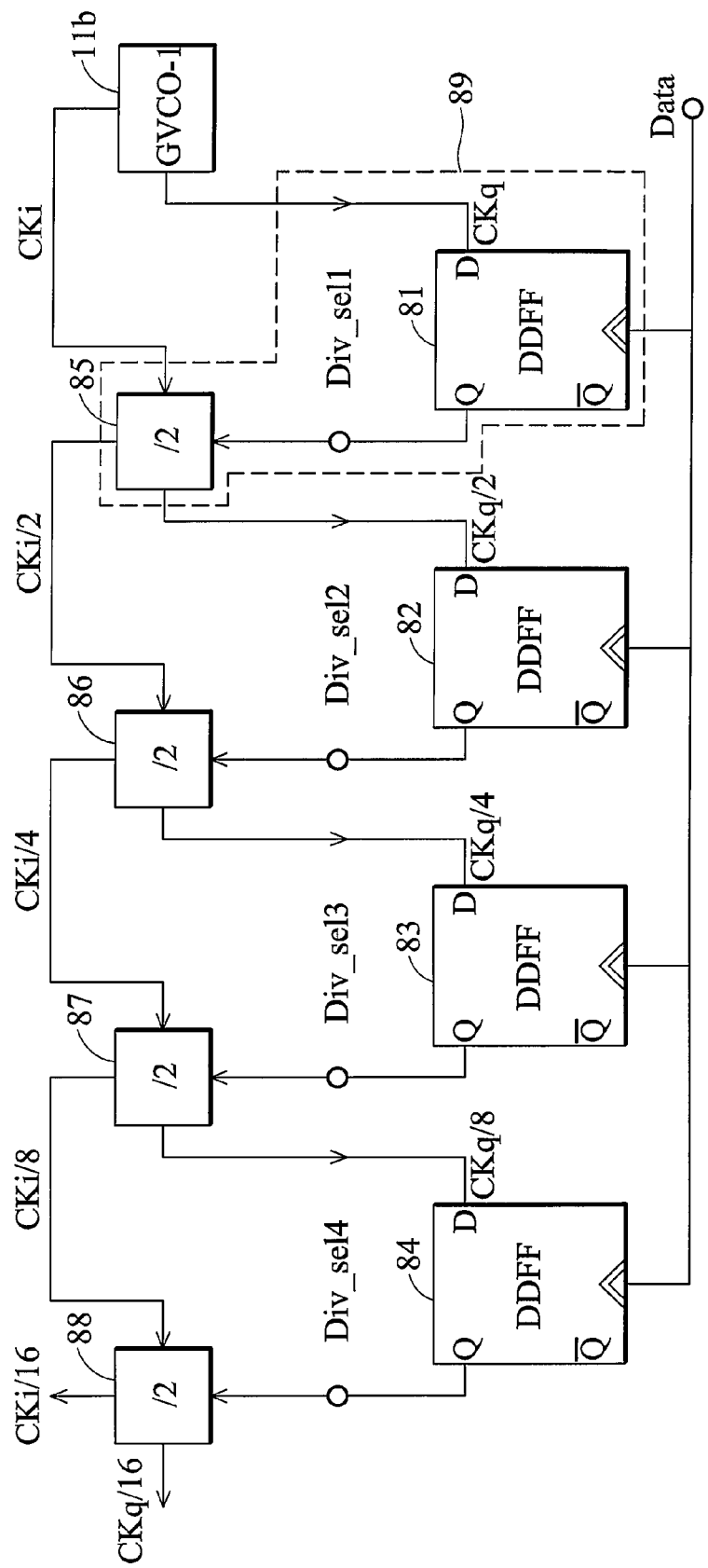
FIG. 7 is a schematic diagram of an embodiment of a phase-controlled frequency divider according to the invention.
Figure 8:
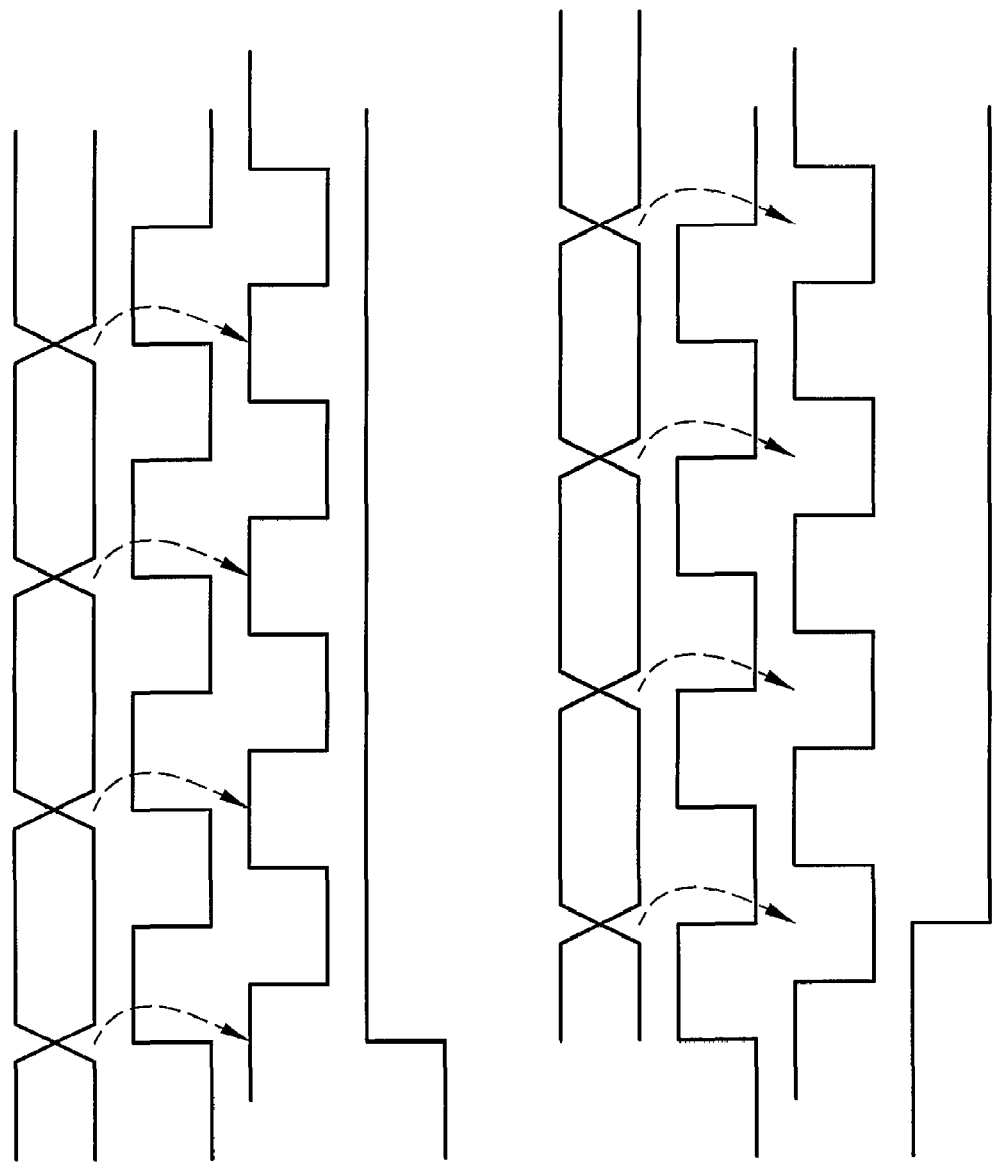
FIG. 8 is a waveform diagram of the phase-controlled frequency divider shown in FIG. 7.

In the proposed clock and data recovery circuit, the GVCO works well for half-rate data at 2.5 Gbps. For a lower data rate, the output clock of the GVCO should be divided for the desired bit rate so as to sample the DDFF correctly. Since the GVCO still oscillates at 1.25 GHz, it is not suited for the data with a lower bit-rate. For example, to consider the 1.25 Gbps data, the proposed GVCO becomes a full-rate one but it still tracks the input data phase. Since any data edge (rising or falling) may correct the phase of the GVCO, two possible steady-state conditions appear in a full-rate operation for our GVCO. In a conventional GVCO, the data may align with the rising or falling edge of the GVCO. It causes a problem when the GVCO is divided by two. It is because both the divide-by-2 in-phase and quadrature-phase clocks have a possibility to be the actual sampling one. To solve this problem, the frequency divider is modified to know which edge (rising or falling) is aligned with the data. The proposed phase-controlled frequency divider is shown in FIG. 7. Every divide-by-2 circuit has a DDFF, where the input data samples the preceding quadrature-phase clock, and the sampled result serves as the divider selection signal (Div_sel). If the preceding in-phase clock's (CKi) rising edge is aligned with data, the first divider selection signal, Div_sel1, is set to ONE. If the preceding in-phase clock's falling edge is aligned with data, the first divider selection signal, Div sel1, is set to be 0. The detail timing diagram of the phase-controlled frequency divider shown in FIG. 7 is shown in FIG. 8.

Figure 9:
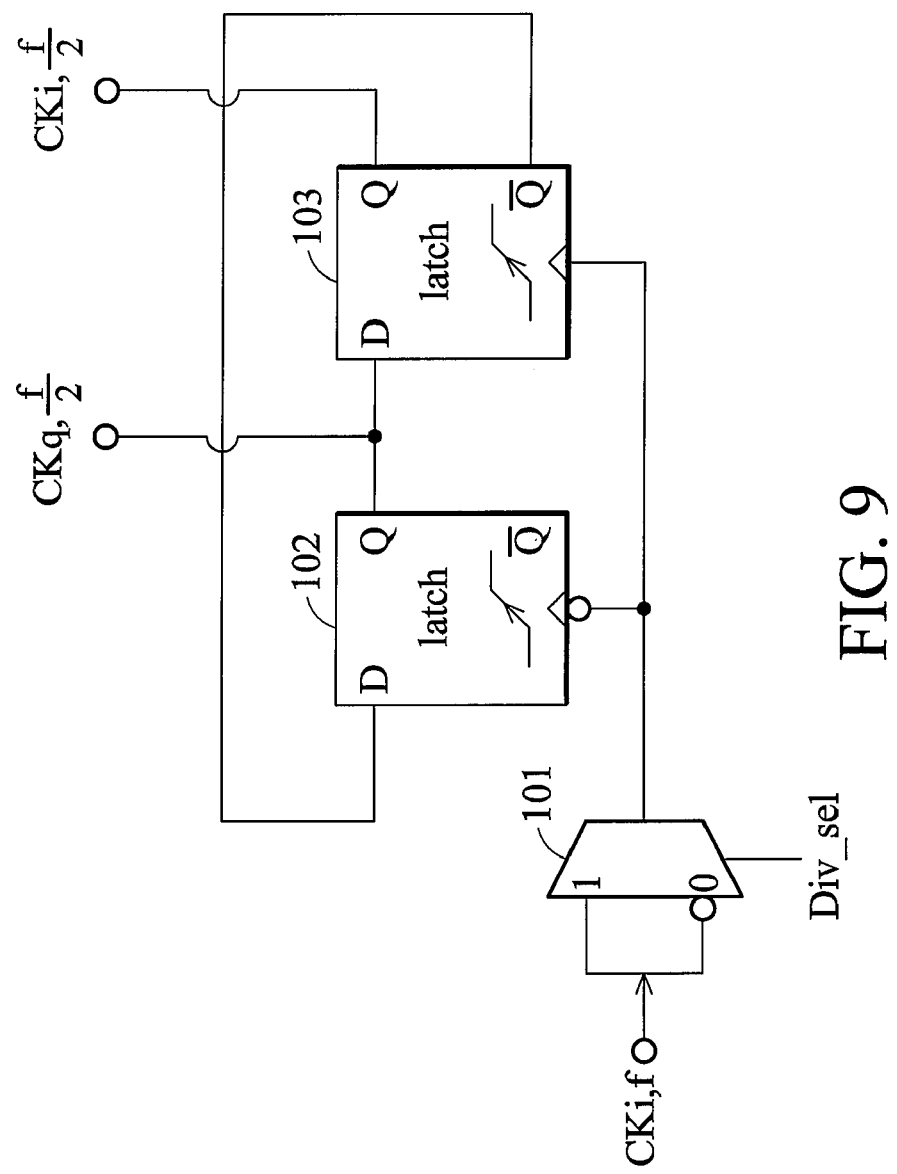
FIG. 9 is a schematic diagram of an embodiment of a phase-controlled divide-by-2 divider.

A phase-controlled divide-by-2 divider is shown in FIG. 9. It is composed of a multiplexer, which is controlled by the selection signal Div_sel, and two edge-triggered DFFs. The multiplexer 101 receives the clock signal Cki and inverted clock signal Cki based on the selection signal Div_sel. The first DFF 102 has a clock input terminal for receiving the output signal from the multiplexer 101 and a data output terminal for outputting the clock signal with half the frequency of the clock signal Cki. The second DFF 103 has a clock input terminal for receiving the output signal from the multiplexer 101, a data input terminal coupled to the data output terminal of the first DFF 102, and a data output terminal coupled to the data input terminal of the first DFF 102, wherein the data output terminal of the second DFF 103 outputs the clock signal with half the frequency of the clock signal Cki.

Figure 11:
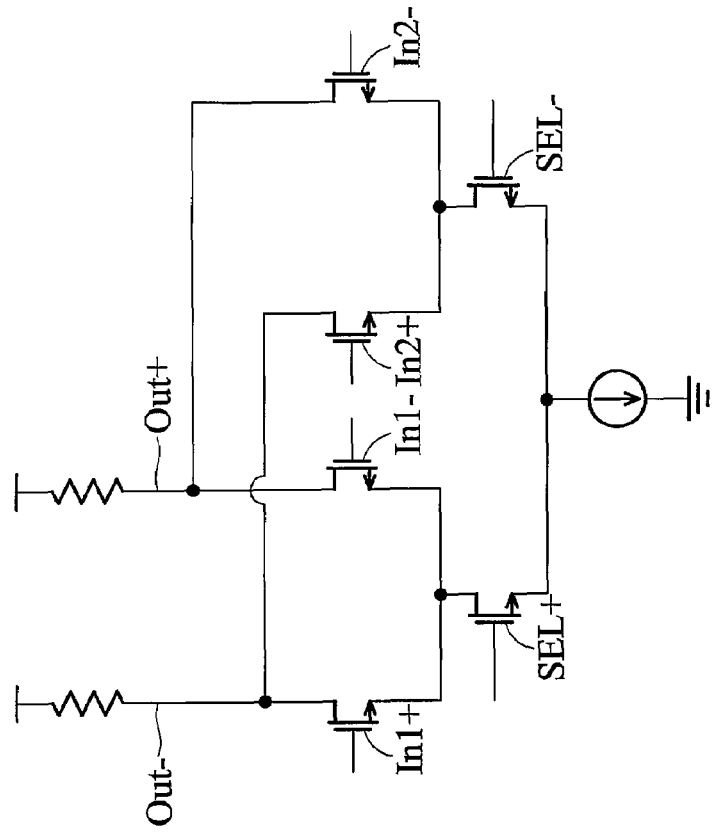
FIG. 11 is a building block diagram of a CML multiplexer according to an embodiment of the invention.
Figure 10:
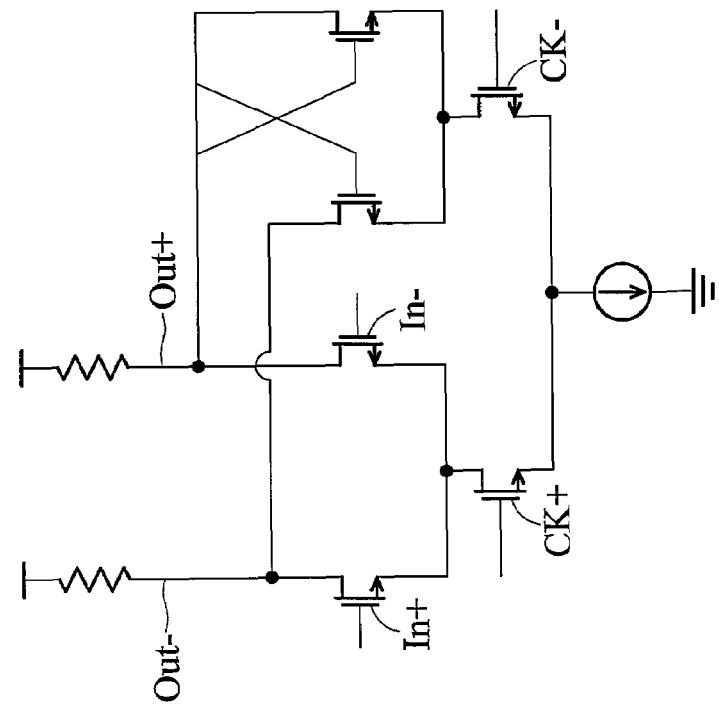
FIG. 10 is a building block diagram of a CML latch according to an embodiment of the invention.
Figure 12:
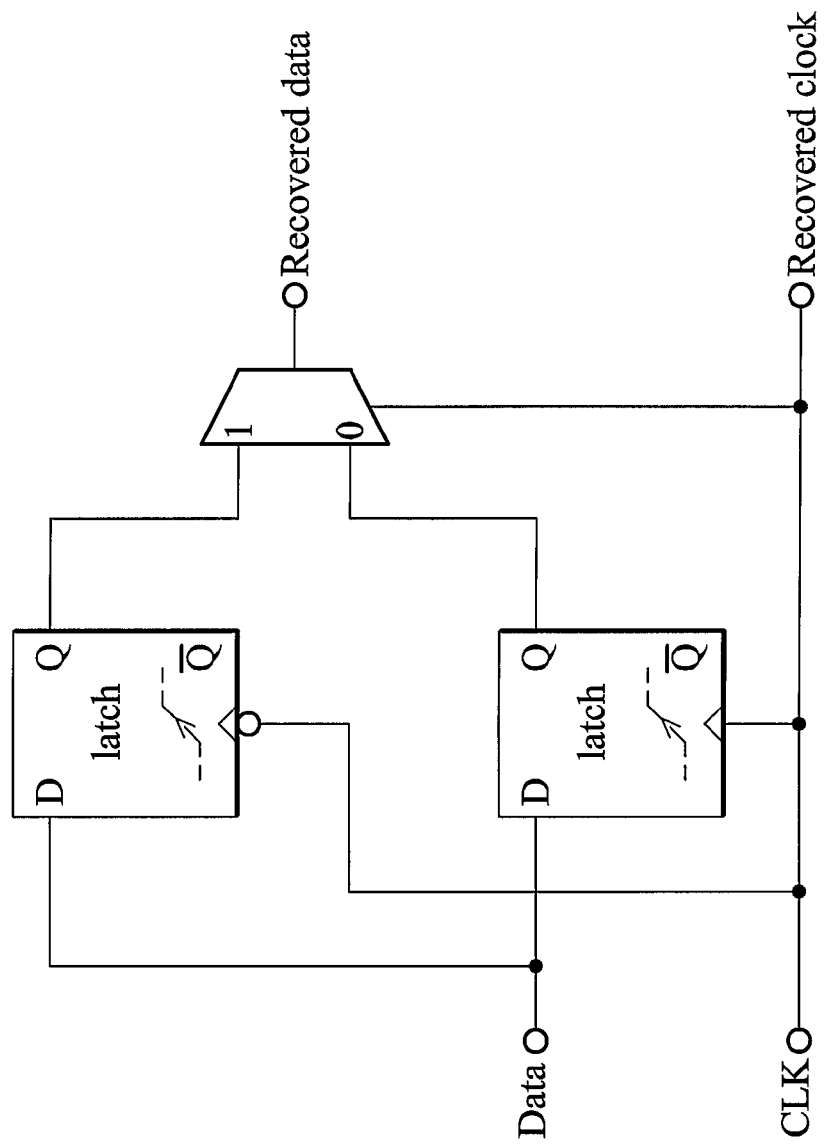
FIG. 12 is a building block diagram of a CML double-edge-triggered D flip-flop according to an embodiment of the invention.

The current-mode logic (CML) circuits are widely used for high speed digital circuits. The CML latch and multiplexer are the basic building blocks to realize all the circuits in the disclosure and they are shown in FIG. 10 and FIG. 11, respectively. The DDFF is shown in FIG. 12, which is composed of two CML latches and a multiplexer.

While the invention has been described by ways of examples and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A gated voltage-controlled oscillator, comprising:
   a first multiplexer comprising a first input terminal, a second input terminal and an output terminal outputting a second clock signal, wherein the output terminal outputs signal from the first input terminal or signal from the second input terminal based on a data signal;
   a second multiplexer comprising a first input terminal, a second input terminal and an output terminal, wherein the output terminal outputs signal from the first input terminal or signal from the second input terminal based on the data signal;
   a third multiplexer comprising a first input terminal inverted coupled to the first input terminal of the second multiplexer, a second input terminal coupled to the inverted second input terminal of the second multiplexer and an output terminal, wherein the output terminal outputs signal from the first input terminal or signal from the second input terminal based on the data signal;

a fourth multiplexer comprising a first input terminal receiving the output signal of the first multiplexer, a second input terminal grounded and an output terminal;

a fifth multiplexer comprising a first input terminal coupled to the output terminal of the third multiplexer, a second input terminal coupled to the output terminal of the fourth multiplexer, and an output terminal coupled to the second input terminal of the third multiplexer; and a sixth multiplexer comprising a first input terminal coupled to the output terminal of the fourth multiplexer, a second input terminal coupled to the output terminal of the second multiplexer, and an output terminal coupled to the first input terminal of the second multiplexer.

2. The oscillator as claimed in claim 1, further comprising a duty cycle correction circuit receiving and outputting the second clock signal.

3. The oscillator as claimed in claim 1, further comprising a buffer, comprising:
   a seventh multiplexer comprising a first input terminal coupled to the output terminal of the first multiplexer, a second input terminal grounded, and an output terminal; and
   an eighth multiplexer comprising a first input terminal coupled to the output terminal of the seventh multiplexer, a second input terminal coupled to the output terminal of the seventh multiplexer, and an output terminal outputting a first clock signal.

4. The oscillator as claimed in claim 1, wherein the multiplexers are current mode logic multiplexers.

5. A clock and data recovery circuit, comprising:
   a first gated voltage-controlled oscillator receiving a data signal and a reference voltage to generate a first clock signal and a second clock signal based on the data signal;
   a PLL unit receiving a reference clock signal and generating the reference voltage to adjust the frequency of the first clock signal and the second clock signal at a vicinity of a predetermined frequency;
   a phase-controlled frequency divider receiving and dividing the first clock signal by N to output a third clock signal;
   a multiplexer controlled by a selection signal, receiving and outputting the second clock signal or the third clock signal;
   a matching circuit receiving the data signal and the selection signal to match the delays therebetween; and
   a double-edge-triggered D flip-flop comprising a data input terminal receiving the output signal from the matching circuit, a clock input terminal receiving the output signal from the multiplexer, and an output terminal outputting a recovered data signal.

6. The circuit as claimed in claim 5, wherein the PLL unit further comprises:
   a second gated voltage-controlled oscillator coupled to a logic one, receiving the reference voltage to duplicate and output the first clock signal and the second clock signal;
   a divider receiving and dividing the first clock signal from the second gated voltage-controlled oscillator by M to output a fourth clock signal;
   a phase frequency detector receiving and comparing the fourth clock signal and the reference clock signal to output a comparison signal; and
   a charge pump circuit receiving and transforming the comparison signal to a current and the reference voltage being determined based on the current.

7. The circuit as claimed in claim 6, further comprising a loop filter formed by a series connected resistor and capacitor.

8. The circuit as claimed in claim 5, wherein the gated voltage-controlled oscillators may have a modified architecture with:
   a fourth multiplexer and fifth multiplexer, coupled together to generate the first clock signal:
   a first multiplexer receiving the reference voltage, comprising a first input terminal, a second input terminal and an output terminal, wherein the output terminal outputs signal from the first input terminal or signal from the second input terminal based on the data signal;
   a second multiplexer comprising a third input terminal receiving an inverted first clock signal, a fourth input terminal receiving the first clock signal, and an output terminal coupled to the first input terminal of the first multiplexer, wherein the output terminal outputs signal from the third input terminal or signal from the fourth input terminal based on the data signal; and
   a third multiplexer comprising a fifth input terminal receiving the first clock signal, a sixth input terminal receiving the inverted first clock signal, and an output terminal coupled to the second input terminal of the first multiplexer, wherein the output terminal outputs signal from the fifth input terminal or signal from the sixth input terminal based on the data signal;
   wherein:
   the fourth multiplexer comprising a seventh input terminal and an eighth input terminal coupled to the output terminal of the first multiplexer, and an output terminal; and
   the fifth multiplexer receiving the reference voltage and comprising a ninth input terminal coupled to the output terminal of the fourth multiplexer, a tenth input terminal grounded, and an output terminal outputting the first clock signal.

9. The circuit as claimed in claim 8, further comprising a buffer comprising a sixth multiplexer comprising an eleventh input terminal and a twelfth input terminal coupled to the output terminal of the first multiplexer, and an output terminal outputting the first clock signal.

10. The circuit as claimed in claim 5, wherein the first gated voltage-controlled oscillator comprises:
    a first multiplexer comprising a first input terminal, a second input terminal and an output terminal outputting the second clock signal, wherein the output terminal outputs signal from the first input terminal or signal from the second input terminal based on the data signal;
    a second multiplexer comprising a first input terminal, a second input terminal and an output terminal, wherein the output terminal outputs signal from the first input terminal or signal from the second input terminal based on the data signal;
    a third multiplexer comprising a first input terminal inverted coupled to the first input terminal of the second multiplexer, a second input terminal coupled to the inverted second input terminal of the second multiplexer and an output terminal, wherein the output terminal outputs signal from the first input terminal or signal from the second input terminal based on the data signal;
    a fourth multiplexer comprising a first input terminal receiving the output signal of the first multiplexer, a second input terminal grounded and an output terminal;

a fifth multiplexer comprising a first input terminal coupled to the output terminal of the third multiplexer, a second input terminal coupled to the output terminal of the fourth multiplexer, and an output terminal coupled to the second input terminal of the third multiplexer;

a sixth multiplexer comprising a first input terminal coupled to the output terminal of the fourth multiplexer, a second input terminal coupled to the output terminal of the second multiplexer, and an output terminal coupled to the first input terminal of the second multiplexer.

11. The circuit as claimed in claim 10, further comprising a duty cycle correction circuit receiving and outputting the second clock signal.

12. The circuit as claimed in claim 10, further comprising a buffer, comprising:
   a seventh multiplexer comprising a first input terminal coupled to the output terminal of the first multiplexer, a second input terminal grounded, and an output terminal; and
   an eighth multiplexer comprising a first input terminal coupled to the output terminal of the seventh multiplexer, a second input terminal coupled to the output terminal of the seventh multiplexer, and an output terminal outputting the first clock signal.

13. The circuit as claimed in claim 10, wherein the multiplexers are current mode logic multiplexers.

14. A clock and data recovery circuit, comprising:
   an oscillator, generating an oscillation signal according to a data signal;
   a phase-controlled frequency divider, receiving and frequency-dividing the oscillation signal to generate at least one divided oscillation signal;
   a multiplexer, controlled by a selection signal, to output the at least one divided oscillation signal from the phase-controlled frequency divider or to output the oscillation signal that the oscillator provides;
   a matching circuit, receiving the data signal and the selection signal to match delays therebetween; and
   a double-edge-triggered D flip-flop, comprising a data input terminal receiving output signal from the matching circuit, a clock input terminal receiving output signal from the multiplexer, and an output terminal outputting a recovered data signal.

15. The clock and data recovery circuit as claimed in claim 14, wherein the oscillator is a gated voltage-controlled oscillator comprising:
   a first stage, comprising at least one input node, at least one inverted input node, and at least one output node; and
   a second stage, comprising at least one input node coupled to the output node of the first stage, and at least one output node coupled to the input node and the inverted input node of the first stage,
   wherein each of the first stage and the second stage comprises at least one multiplexer, and the at least one multiplexer in the first stage is controlled by the data signal.

16. The clock and data recovery circuit as claimed in claim 14, wherein the oscillator is a gated voltage-controlled oscillator which provides a first oscillation loop when the data signal is high and provides a second oscillation loop when the data signal is low, and the first and second oscillation loop share at least one multiplexer.

* * * * *